US006537388B1

(12) United States Patent
Wynns et al.

(10) Patent No.: US 6,537,388 B1
(45) Date of Patent: Mar. 25, 2003

(54) SURFACE ALLOY SYSTEM CONVERSION FOR HIGH TEMPERATURE APPLICATIONS

(75) Inventors: Kim A. Wynns, Spring, TX (US); George T. Bayer, Tarentum, PA (US)

(73) Assignee: Alon, Inc., Leechburg, PA (US)

( * ) Notice: Subject to any disclaimer, the term of this patent is extended or adjusted under 35 U.S.C. 154(b) by 31 days.

(21) Appl. No.: 09/698,856

(22) Filed: Oct. 27, 2000

Related U.S. Application Data

(63) Continuation-in-part of application No. 09/255,596, filed on Feb. 22, 1999, now Pat. No. 6,139,649, and a continuation-in-part of application No. 08/702,175, filed on Aug. 23, 1996, now Pat. No. 5,873,951.

(51) Int. Cl.$^7$ .................................................. C23C 8/06
(52) U.S. Cl. ..................... 148/279; 178/283; 427/250; 427/252; 427/376.2; 427/376.8
(58) Field of Search .............................. 178/279, 283; 427/250, 252, 376.2, 376.8

(56) References Cited

U.S. PATENT DOCUMENTS

| | | | |
|---|---|---|---|
| 3,690,934 A | * | 9/1972 | Galmiche et al. ....... 416/241 R |
| 3,801,353 A | * | 4/1974 | Brill-Edwards ............. 415/200 |
| 3,846,159 A | * | 11/1974 | Bornstein et al. ........... 148/404 |
| 3,874,901 A | | 4/1975 | Rairden, III |
| 4,087,589 A | | 5/1978 | Bessen |

(List continued on next page.)

FOREIGN PATENT DOCUMENTS

| | | |
|---|---|---|
| CA | 2175439 | 10/1997 |
| WO | WO97/16507 | 5/1997 |

OTHER PUBLICATIONS

Thermodynamics and Kinetics of Pack Cementation Processes, Leslie L. Seigle, Department of Materials Science and Engineering, State University of New York at Stony Brook, pp. 345–369 (No Date).

(List continued on next page.)

*Primary Examiner*—John Sheehan
*Assistant Examiner*—Andrew L. Oltmans
(74) *Attorney, Agent, or Firm*—Buchanan Ingersoll, P.C.

(57) ABSTRACT

Chromium, silicon, aluminum, and optionally manganese are diffused onto the surface of a high temperature alloy product, to provide a coating having improved resistance to carburization and catalytic coke formation and smoother surfaces for high temperature hydrocarbon environments. Preferably, a first layer of chromium or chromium and silicon is deposited and diffusion heat-treated and covered by the second layer of aluminum or aluminum-silicon. The inner layer contains a minimum of 8 weight percent chromium above that contained in the substrate alloy. The outer layer contains a minimum of 20 weight percent aluminum at the coating surface. The coating system is then aged to yield the improved coating that has 60 to 90 weight percent chromium at the surface. Each layer or the combination of layers is diffusion heat treated to cause a diffusion depth ranging from 0.006 inch (0.1524 millimeter) to 0.030 inch (0.762 millimeter) with targeted 0.012 inch (0.3048 millimeter) to 0.015 inch (0.3810 millimeter). The aging process to achieve the desired chromium and manganese migration is 700° C. to 1150° C. (1292° F. to 2102° F.). This diffusion alloy system is weldable after process and after aging. This coating system provided enhanced carburization resistance, resistance to catalytic coke formation, and surface smoothness.

15 Claims, 2 Drawing Sheets

U.S. PATENT DOCUMENTS

| | | | |
|---|---|---|---|
| 4,208,453 A | | 6/1980 | Baldi |
| 4,290,391 A | | 9/1981 | Baldi |
| 4,845,139 A | * | 7/1989 | Baldi ........................ 148/22 |
| 5,364,659 A | | 11/1994 | Rapp et al. |
| 5,492,727 A | | 2/1996 | Rapp et al. |
| 5,589,220 A | | 12/1996 | Rapp et al. |
| 6,093,260 A | | 7/2000 | Petrone et al. |

OTHER PUBLICATIONS

Absolute Rates of Coke Formation: A Relative Measure for the Assessment of the Chemical Behavior of High–Temperature Steels of Different Sources by G. Zimmerman, W. Zychlinski, H. Woerde and P. Oosterkamp, Ind. Eng. Chem. Res. 1998, 37, 4302–4305 (No Month Data).

"Effect of Chromium on the Protective Properties of Aluminide Coatings" by K. Godlewski and E. Godlewska, Oxidation of Metals, vol. 26, Nos. 1/2, 1986 (No Month Data).

"Chromaluminizing of Nickel and Its Alloys" by E. Godlewska and K. Godlewski, Oxidation of Metals, vol. 22, Nos. 3/4, 1984 (No Month Data).

"Carburization—Introductory Survey" by A. Rahmel, H.J. Grabke and W. Steinkusch, Materials and Corrosion 49, 221–225 (1998) (No Month Data).

"Carburization of High Chromium Alloys" by T.A. Ramanarayanan, R.A. Petkovic, J.D. Mumford and A. Ozekcin, Materials and Corrosion 49, 226–230 (1998) (No Month Data).

* cited by examiner

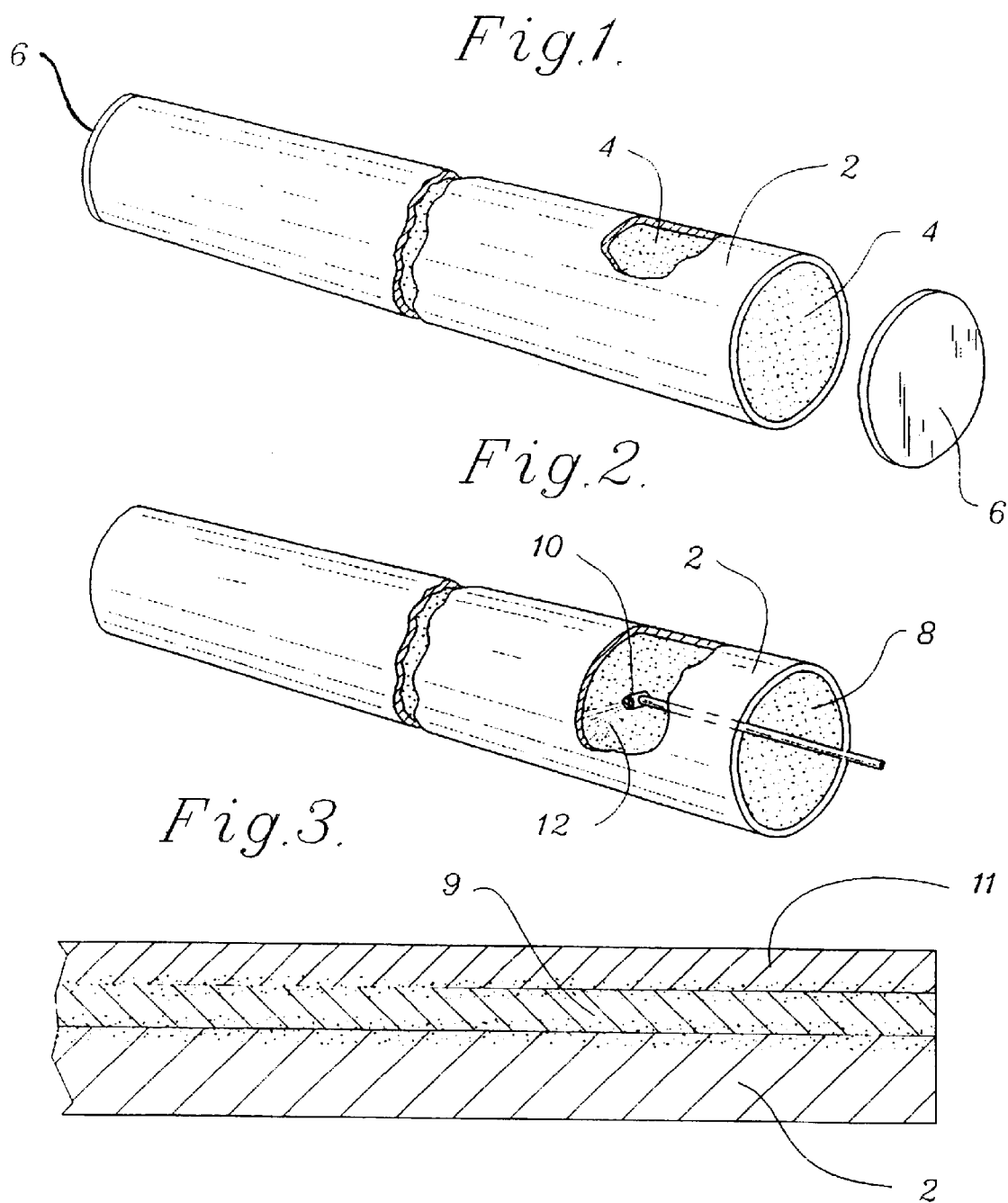

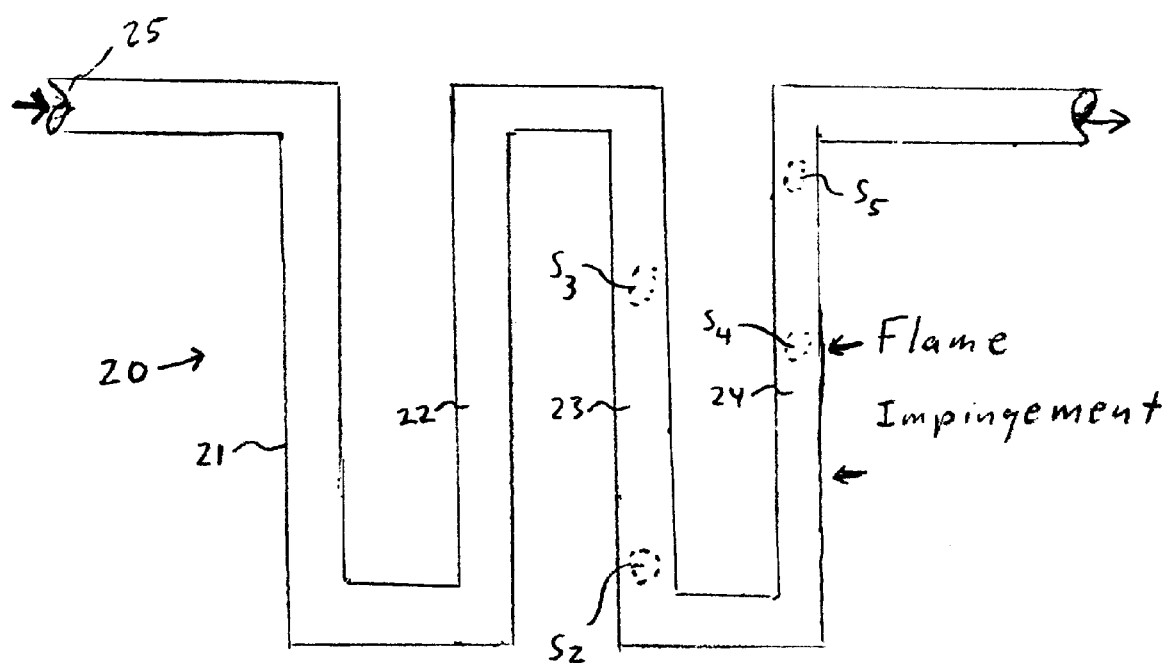

SURFACE ALLOY SYSTEM CONVERSION FOR HIGH TEMPERATURE APPLICATIONS

CROSS REFERENCE TO RELATED APPLICATION

This application is a continuation-in-part of U.S. application Ser. No. 08/702,175, filed Aug. 23, 1996, now U.S. Pat. No. 5,873,951 and Ser. No. 09/255,596 filed Feb. 22, 1999 now U.S. Pat. No. 6,139,649.

FIELD OF INVENTION

The invention relates to an alloy system applied as a coating on metal tubes used in high temperature applications such as ethylene production to resist carburization, inhibit catalytic coke formation, and resist coke fouling.

BACKGROUND OF THE INVENTION

Ethylene is produced by passing a feedstock containing naphtha, ethane, and other distillates through a furnace comprised of a series of tubes. In the production of ethylene there are components that operate at elevated temperatures such as the cracking furnace, transfer piping, quench exchangers and transfer line exchangers (TLEs). These components are exposed to a high temperature environment that can operate in reducing or oxidizing or alternately between both conditions. To achieve desired creep strength, mechanical requirements, and oxidation resistance, the furnace tubes are made of higher alloys such as the wrought Alloy 800 series, and centrifugally or static cast alloys such as HK, HP and 45Ni—35Cr alloys. The feedstock enters the furnace at a temperature of about 1000° F. (540° C.) where it is heated to about 1650° F. (900° C.). During the process pyrolytic coke is produced. Some of the coke accumulates on the walls of the furnace tubes. Nickel and iron in the tubes react with the coke to form long whisker-like structures that extend from the walls of the tubes called catalytic coke. These strands tend to catch pyrolytic coke passing through the tubes to form a complex amorphous coke layer on the inner wall of the furnace tubes. This amorphous coke layer acts as an insulator increasing the temperature of the inner walls in order to deliver adequate heat to the process stream to crack the feedstock. Consequently, the furnace must be periodically cleaned to remove this layer of coke. This cleaning is often called de-coking. At many locations the tubes must be cleaned every 30 days.

1. Brief Description of the Prior Art

The art has attempted to control catalytic coking by the selection of high chromium and nickel alloys with significant silicon content or by applying a chromium or aluminum or ceramic coating to the inner walls of the furnace tube. However, higher chromium coatings introduce instability in the alloy structures. Aluminum coatings have found limited success on wrought alloys with process temperatures not exceeding 1650° F. (900° C.). At higher temperatures interdiffusion and spalling can occur. Solid ceramic coatings suffer from cracking and spalling.

Coatings of two or more materials have also been proposed for metals used in high temperature process applications. Bessen in U.S. Pat. No. 4,087,589 discloses methods for applying a chromium coating, an aluminum coating or a chromium coating followed by an aluminum coating on a nickel base alloy. In Japanese Patent 80029151 there is disclosed a method for applying a chromium-aluminum-silicon coating. This coating is produced by a chromium pack cementation process followed by an aluminum-silicon pack cementation process. The coated metal is said to be useful for jet engines, gas turbines and internal combustion engines. In U.S. Pat. No. 3,365,327 there is disclosed a method for vapor diffusion coating metallic articles with aluminum-chromium-silicon to provide elevated temperature corrosion resistance for gas turbine and oil refinery applications. The technique involves a slurry coating followed by high temperature firing. There is no teaching in any of these references that such coatings would be useful for ethylene furnace tubes.

In our U.S. Pat. No. 5,873,951 we disclose a method for coating ethylene furnace tubes made from iron-nickel-chromium alloys in which we apply a chromium diffusion coating, clean and roughen that coating, apply a second coating containing aluminum that also has a nickel and iron-rich overlay and then we polish the second coating to remove that overlay. In our U.S. patent application Ser. No. 09/255,596 now U.S. Pat. No. 6,139,647 we disclose a method of coating products formed from an iron-nickel-chromium alloy in which we expose the surface of the alloy to hydrogen to remove diffusion limiting oxides and then diffuse chromium or other metals onto the prepared surface.

The prior art as a whole, thus, teaches various methods of applying coatings containing chromium or aluminum to nickel based alloy tubes and other products. The references also report the thickness of the coatings and even the principal elements in the coatings. Many of the prior art chromium and aluminum coatings have been effective to some extent in resisting corrosion and in reducing carburization and coking problems. Nevertheless, these coatings continually fail after some period of time, and others must be cleaned at regular intervals that could be as short as 30 days. Thus, there is a need for coatings which last longer and resist fouling or coke build-up for longer periods of time.

The failure of the art to develop longer lasting coating systems, particularly ethylene furnace tubes is the result of a lack of understanding of what happens to these coatings over time. Although several people have attempted to understand and explain why chromium or aluminum based coatings fail in high temperature applications, there has been only limited understanding of what makes a long-lasting coating for ethylene furnace tubes and other products exposed to a high temperature environment in reducing or oxidizing environments. We have learned that a greater understanding of these systems could only come from a long term study of chromium and aluminum based coatings on tubes used in an ethylene production furnace.

2. Carburization and Catalytic Coking

The production process of making ethylene from hydrocarbon feedstocks, such as ethane, propane, naphtha and mixed precursors, creates violent thermal cracking of the hydrocarbon feedstock causing the liberation of carbon species. The carbon is in the form of CO (carbon monoxide) and $CO_2$ (carbon dioxide) which has the propensity to diffuse into the base material. This action of carbon ingress causes the depletion of chromium due to the formation of chromium carbides and it exposes the other elements in the base material to the process environment.

The stages and mechanisms of carburization in iron-nickel-chromium alloys are taught in the paper "Carburization of high chromium alloys" by Ramanarayanan, Petkovic, Mumford and Ozekein, as well as in the paper "Carburization—introductory survey" by Rahmel, Grabke and Steinkusch. Ramanarayanan et al. discuss the oxygen chemical potential and the carbon chemical potential, the key point being that there must be enough of an oxide ($Cr_2O_4$-spinel or $Cr_2O_3$) to resist the ingress of carbon. Rahmel et al. discuss the need for sufficient chromium on the surface, and the instability of chromium oxides with materials that have less than 30 weight percent chromium in their base metallurgy. The solubility of carbon in chromium is determined by the amount of chromium in the substrate alloy. For example, the solubility of carbon in an alloy containing 32 weight percent chromium is less than 0.02 weight percent carbon. The solubility of carbon in chromium approaches zero when the chromium content is approximately 40 weight percent. Based on these data, the conclusion that can be drawn here is that if there is a stable $Cr_2O_3$ layer then there will be no carbon ingress or permeation into the base material.

The exposure of nickel and iron to such high carbon activity process gases is known to cause what is called catalytic coking, growing from the metal species to form filamentous coke. This filamentous coke is most detrimental to the process efficiencies because there is extra CO generated and there is a rapid collection of naturally occurring thermal coke adhering and building up on the tube wall. This coke build-up creates short run times and limits the amount of ethylene that can be produced with a given amount of energy input. There is also the problem of long decoke times of a furnace due to the presence of catalytic coke and excess carbon in the base metal. All of these problems increase over time due to the continued diffusion of carbon into the base metal.

3. Our Long-term Study

We have done metallographic evaluations of ethylene furnace tubes coated in accordance with the methods disclosed in our above-identified U.S. Pat. No. 5,873,951 and application Ser. No. 09/255,596 now U.S. Pat. No. 6,139,647 after 27 months in-service. Through performance of several long term aging tests, we now understand how the diffusion coating system functions to stop carburization, to reduce catalytic coke formation, and to smooth the surface, acting as an anti-stick interface for the process and available carbon. The aluminum oxides that are formed as part of the oxidizing decoke process that is performed on the furnace tubes in effect burns off the carbon by oxidation, all the while oxidizing the aluminum rich outer layer. But that is not what transpires over the long term. According to Fick's law, chromium naturally migrates within an alloy when the concentration gradient is sufficient and the temperatures promote high diffusivity. This usually occurs around 750° C. (1380° F.) and higher temperatures. Prior art chromium coatings have contained in excess of 10 to 20 weight percent chromium in the initial diffusion layer to change this zone from austenite to a very high temperature stable phase. The art also follows this first step with a predominantly aluminum diffusion second step that uses the chromium step as its barrier to continual diffusion. While this is all true and is proven in short term aging, we have discovered that the effectiveness of the diffusion system is defined by the aluminum combining with nickel and iron that have diffused counter to both the chromium and aluminum. These nickel and iron aluminides form a barrier to further chromium diffusion to the surface. The art has known about the ability of the initial chromium to limit continued aluminum diffusion, however it did not know how the aluminum second step limited the chromium diffusion.

Our long term aging study has also identified another attribute of chromium and aluminum diffusion coatings. That is the ability of the diffusion system to allow small amounts of chromium to migrate through the metal aluminides and form a most stable chromium layer on the very surface. This chromium layer has been known to contain from 60 to 90 weight percent chromium and range from less than 0.00004 inch (1 micrometer) to 0.00024 inch (6 micrometers) in thickness, which characterizes the art. Godlewski and Godlewska teach in the paper "Effect of Chromium on the Protective Properties of Aluminide Coatings" that chromium present in the surface layers of aluminide coatings has a beneficial effect on their resistance to oxidation and hot corrosion. Additionally, careful studies such as taught in the paper "Carburization of High Chromium Alloys" by Ramanarayanan et al. have identified that the art develops a supporting special crystalline spinel structure just below the very surface of the new chromium layer. This crystalline spinel structure which is also formed over time at elevated temperatures further provides support to the new chromium layer. The art of the conversion of the diffusion coating system included the available spinel forming metals just below the chromium and the actual formation of a thin spinel layer via a supporting crystalline compound. We have observed that it is the manganese, iron, aluminum and silicon, which are available just below the new chromium layer, that enables the chromium layer to tolerate the elevated temperatures seen in ethylene steam crackers.

Prior art has taught that diffusion coatings are stable when applied to iron-, nickel-, and cobalt-base alloys containing alloying elements such as chromium, manganese, titanium, nitrogen, niobium, tungsten, aluminum, and silicon. Yet, the art failed to recognize that chromium, silicon and aluminum must all be present in the coating in sufficient amounts to create an effective long lasting coating for tubes used in ethylene furnaces. As an example, Godlewska and Godlewski have taught in the paper "Chromaluminizing of Nickel and Its Alloys" that a two step chromium-aluminum diffusion coating can be formed on nickel alloys. However, spallation occurs in the coating because the aluminum content of their coating system is too high. Petrone, Mandyam and Wysiekierski teach in U.S. Pat. No. 6,093,260 a two layer chromium-silicon-titanium-aluminum coating system which may or may not contain aluminum in the outer layer, and never contains more than 15 weight percent aluminum. However, their aluminum concentration is too low to provide the exceptional resistance to catalytic coke formation afforded by an aluminum diffusion coating as taught in the present invention. Rapp, Wang, and Pangestuti teach in U.S. Pat. Nos. 5,492,727 and 5,589,220 a method for the simultaneous deposition of chromium and silicon. However, the key element aluminum is not present in this diffusion coating system. Woerde, Zimmermann, Steurbaut, Van Buren, and Gommans teach in PCT WO/97/16507 a process for diffusion of chromium followed by diffusion of aluminum. A similar process is disclosed by Rairden, III in U.S. Pat. No. 3,874,901. However, the phase stabilizing and highly carburization resistant element silicon is not included in either diffusion process. Silicon plays two major roles in the improved diffusion coating system taught here. First, it considerably slows down the formation of a blocking chromium carbide layer during the chemical vapor deposition (CVD) or physical vapor deposition (PVD) process, thus allowing enhanced deposition of pure chromium into the substrate alloy. Second, it allows the chromium to diffuse more deeply into the substrate alloy during the high temperature diffusion process.

It is also taught in the literature that these diffusion coating systems are steady state. We have discovered that there can be a metastable as-diffused coating system, which is altered or aged at elevated temperature to a more stable system. This is accomplished by transforming the coating system via the preferential migration of chromium and manganese through diffusion barriers to establish the final condition of the diffusion coating system that can stop carburization and catalytic coke formation. Based upon our analysis of furnace tubes and fitting samples that were removed from an ethylene steam cracker in-service that had experienced uncharacteristically high metal temperatures we have gained greater understanding of the coatings. From that understanding we are now able to disclose and define effective coatings that can operate in high temperature environments while being exposed to oxidizing conditions or reducing conditions. More particularly, by observing how these coatings change over time, we are now able to tell the art what an effective coating can contain. Then, prior art coating processes can be modified and controlled to create such coatings.

SUMMARY OF THE INVENTION

We have discovered that the key to the successful performance of the patented diffusion coating system, as described in U.S. Pat. No. 5,873,951, is not just in the steps identified in the diffusion system, nor just in the synergistic combination of elements. Rather, there is a unique conversion of the diffusion system. This conversion is accomplished by heating the diffusion system between either an aging process or in situ operation in an actual ethylene steam cracker furnace. The present diffusion coating system calls for the first step of chromium and silicon diffusion followed by a second step aluminum or aluminum and silicon diffusion. This in itself does not totally protect the base material from carburization and catalytic coke formation. Heating the diffusion coating system for a period of time in the 1292° F. to 2102° F. (700° C. to 1150° C.) temperature range allows for a balanced amount of chromium to migrate through the second step layer of aluminum to form a high concentration of chromium on the surface. This chromium is supported by spinel forming metal elements of iron and manganese from the base metal and aluminum and silicon in the coating. The new surface formed by this migration is stable, noted by the lack of depletion of chromium from the first layer and the lack of depletion of aluminum from the second layer.

We provide an improved diffusion coating system of a type which stops carburization of the base metal and which stops the formation of catalytic coke. We also provide a surface roughness that is greatly reduced from the as machined, as cast or as produced tube and fitting. Surface roughness measurements have been reduced from 125 AAH to 300 AAH (average arithmetic height) in the as produced condition to 20 AAH to 40 AAH after aging or time in service. The diffusion coating system can be applied to furnace tubes, fittings, outlet piping, transfer line exchangers, quench headers and any component that is exposed to a high temperature hydrocarbon. This diffusion coating system can be applied by either chemical vapor deposition (CVD) or physical vapor deposition (PVD), or by a combination of both. Whatever method is used, we deposit a sufficient amount of chromium, chromium-silicon or multiple combinations thereof followed by aluminum, aluminum-silicon or multiple combinations thereof. The surface of the part, usually a tube, is first prepared by cleaning to remove all rust, corrosion products, scale and loose debris in preparation for exposing the surface to diffusion or deposition of desired elements. The chromium, aluminum, and silicon, and possibly other coating materials such as manganese, are CVD or PVD deposited in a single step or alternatively by multiple metal layers. The metal layers are either diffusion heat treated in situ or are layered with subsequent intermediate PVD deposited chemistry such as silicon. The single metal layer or multiple metal layers are diffusion heat treated into the base material of iron-nickel-chromium alloys such as stainless steels. The alloys may be either wrought or cast. The diffusion thickness varies from 0.002 inch (0.0508 millimeter) to 0.030 inch (0.762 millimeter) with resultant maximum targeted from 0.012 inch (0.3048 millimeter) to 0.015 inch (0.381 millimeter). The CVD transport methods can be pack cementation, slurry or ceramic carrier, while the PVD transport method can utilize solid master alloys, sintered powder, powder, inserts, slurry, or ceramic cartridge. The PVD method results in a slightly smoother surface than the CVD method. Weld overlay processes and thermal spray processes may also be used to deposit the single or multiple layers. Post process polishing is an option but not entirely necessary.

Other objects and advantages of the present invention can be understood from a description of certain present preferred embodiments shown in the drawings.

BRIEF DESCRIPTION OF THE FIGURES

FIG. 1 is a perspective view partially cut away of a tube containing a pack for applying a first step chromium-silicon or second step aluminum-silicon coating in accordance with a first preferred embodiment of our method.

FIG. 2 is a perspective view similar to FIG. 1 showing application of the second coating in accordance with the first preferred embodiment.

FIG. 3 is a cross sectional view of a portion of a furnace tube to which our coating has been applied.

FIG. 4 is a diagram of a coil in an ethylene furnace of the type used in our long term study with the location of the samples that we analyzed circled in dotted lines.

DESCRIPTION OF THE PREFERRED EMBODIMENTS

We provide an improved method for protecting high temperature alloys containing iron, nickel, chromium, and other elements from the deleterious effects of carburization and catalytic coke formation. This method involves applying a diffusion coating system of chromium, silicon, aluminum and optionally manganese that is designed to protect the base material surfaces from carburization damage and catalytic coke formation while maintaining a smoother surface after aging or operation in service to transform the as-processed diffusion system. The diffusion system can be applied as a single step or multiple steps. The coating is applied to those surfaces, which are exposed to the high temperature environment. Furnace tubes, fittings, exchanger tubes, process piping and other components are coated on the surface exposed to the high temperature environment. To process the inside surface of tubes they can be filled with a pack cementation mix or PVD target with the designed metal system barrier metal and sealed with caps on both ends. Baldi in U.S. Pat. Nos. 4,208,453 and 4,290,391 teaches related methods for diffusion coating the interior surfaces of tubing. Baldi's method, however, is designed specifically for chromizing of low alloy iron-chromium steam boiler tubes. In the present invention, caps are welded or sealed on either end of the tube. The capped tube is then put through the process to generate a diffusion heat-treated coating of chromium-silicon followed by a second layer of aluminum or aluminum-silicon. The diffusion layer thickness depth after both diffusion steps are completed should result in a range of 0.002 inch (0.0508 millimeter) to 0.030 inch (0.762 millimeter) with a desired maximum diffusion depth of 0.012 inch (0.3048 millimeter) to 0.015 inch (0.381 millimeter).

In a first preferred embodiment of our method we first diffuse chromium and silicon onto the metal surface. We use a dual activator containing a fluoride salt and a chloride salt, at least one of those salts being of an ammonium type, as taught by Bayer and Wynns in U.S. Pat. No. 5,972,429. Although the method could be used to coat both tubular and flat stock as well as finished components, in the process illustrated in FIG. 1 tubes or pipes are provided with a diffusion coating on their inner wall. It should be understood however that our method is not limited to pack cementation and can be used in other diffusion techniques such as masteralloy-activator-filler composite inserts and sheets. Referring to FIG. 1 we illustrate a tube or pipe 2, which can be of any desired length and may include both straight portions and return bends. The tube is filled with a pack mix composition 4 having a dual activator containing a fluoride salt and a chloride salt at least one of those salts being of an ammonium type. The pack mix also contains pure chromium or a ferro-chromium alloy, pure silicon or a ferro-silicon alloy and a filler such as aluminum oxide. If a ferrochromium alloy is used as the chromium source, a ferrosilicon alloy should be used as the silicon source. The ends of the tube are closed by caps 6 and the tube is heated in a retort furnace to cause the ammonium salt to decompose forming a reducing environment and to allow chromium and silicon to diffuse onto the surface of the iron-containing alloy product forming a chromium-silicon coating.

The advantage to using ammonium chloride as an activator in this chromium-silicon diffusion coating process is that ammonium chloride decomposes at 642° F. (340° C.). The improved furnace of claim 20 wherein the surface of the coating contains to form ammonia and hydrogen chloride. Upon further temperature increases, the ammonia cracks to form nitrogen and hydrogen. Two benefits are evident. First, the hydrogen chloride generated increases the overall chemical reactivity of the pack increasing the rate of formation of both volatile chromium-silicon chloride species which are transported to the substrate surface and deposit chromiumsilicon via chemical reaction and gas phase mass transport. Second, the hydrogen generated allows for an additional reduction reaction at the substrate surface causing a more rapid decomposition of the chromium and silicon chlorides and fluorides and thus a more rapid deposition of chromium and silicon metal onto the substrate. Also, the reducing atmosphere keeps the substrate free of diffusion limiting oxides. This has been discussed previously in a study of the thermodynamics and kinetics of pack cementation processes in "Thermodynamics and Kinetics of Pack Cementation Processes," by L. L. Seigle, *Surface Engineering,* Martinus Niehoff Publishers, Dordrecht, 1984, pp. 345–369. Calcium fluoride is an effective second activator because the presence of fluoride improves the coating process by increasing the silicon content of the coating.

In a first preferred embodiment of our method for the second step diffusion of aluminum and silicon, we use a single activator containing a chloride salt. Again, the process is similar to that for the diffusion of chromium and silicon, and FIG. 1 and its description again applies.

Either the chromium-silicon layer or the aluminum coating layer could be applied by physical vapor deposition (PVD). FIG. 2 illustrates a process in which the interior of the tube contains the chromium-silicon layer applied by pack cementation or PVD and the aluminum coating layer is being applied. After the diffusion coating that forms the chromium-silicon layer has cooled sufficiently we thoroughly clean, neutralize and grit blast the coating. This provides a first coating surface which is receptive to the second stage coating. The second stage coating is either a diffusion coating of aluminum alone or of an aluminumsilicon combination. As shown in FIG. 2, we provide a pipe 2 which has an inner surface 8 containing the chromium or chromium-silicon coating indicated by the dotted surface shading. A diffusion spray head 10 is inserted into the tube. This head provides a thermal spray 12 of aluminum or an aluminum-silicon combination. The spray forms the second coating over the first coating.

Alternatively, the coating could be applied using PVD with a hydrogen pretreatment. This process can also be explained with reference to FIG. 1. A furnace tube or pipe 2 can be of any desired length and may include both straight portions and return bends. The inside surface of the tube is cleaned with hydrogen. Then the tube is filled with a PVD target having a designed metal system or initial chromium based barrier metal and sealed with caps on both ends. Caps 6 are welded or sealed on either end of the tube. The capped tube is then put under a vacuum and purged with argon. The PVD generator is then engaged to supply the desired elements within the tube. The desired elements are deposited on the surface of the tube wall. Once the metals are deposited on the tube walls the tube wall is heated with conventional heating elements, gas fired or heated by electrical resistance or induction heating to a temperature high enough to diffuse the elements into the inside tube wall. The first diffusion layer thickness depth should result in a range of 0.0004 inch (10 micrometers) to 0.006 inch (150 micrometers) with a desired maximum diffusion depth of 0.01 inch (250 micrometers). Since physical vapor deposition is well known in the art, those skilled in the art will recognize that apparatus different from that shown in the drawing could be used.

After the diffusion coating is completed, then the inside surface is again cleaned with hydrogen at elevated temperatures to prepare the surface for the conversion process. Once the surface has been cleaned with high temperature hydrogen, then argon, nitrogen, helium and/or oxygen is again introduced into the tube and a vacuum is put on the inside surface. Cleaning can be done at temperatures between 1600° F. (871° C.) and 2000° F. (1204° C.). The inside is heated to a sufficient temperature with the introduction of a steam or steam or steam/air mixture to convert the aluminum and magnesium and titanium to a ceramic-like spinel ($MgAl_2O_4$), but with the heating focused only on the inside surface so as not as to overheat the base material. This ceramic-like spinel structure also increases the surface hardness over that of the substrate alloy and resists metal loss from erosion. We have found that temperatures ranging from 2200° F. (1204° C.) to 2800° F. (1538° C.) are sufficient depending upon the coating material. Once this is converted and formed at least 0.00008 inch (2 micrometers) thick on the surface then the immediate surface is pretreated to form the most solid oxide available utilizing the PVD vacuum system and gas design capabilities. This pretreatment is the combination of a gas mixture of nitrogen, argon, helium and/or oxygen at elevated temperature in excess of 2200° F. (1205° C.). The final surface of the ID may be polished following the last pretreatment step to minimize nucleation sites for coke deposition. Welding together of the tubes is accomplished using special bevel preparation and typical weld wire and purge techniques historically used for ethylene furnace tube fabrication.

A sectional view of the final coating is shown in FIG. 3. The coating could be on sheet, tube or bar stock but more likely would be on a particular metal product such as furnace tubes, fittings, exchanger tubes, chemical process piping, process fittings, valves, pumps, compressors, boiler components, steam piping, or waste heat incinerators. For purposes of illustration we show two distinct layers 9 and 11 of uniform thickness. It will be understood by those skilled in the art that some diffusion will occur between layers to create a strong bond. The pipe 2 has a first coating layer 9 of chromium and silicon. This coating should be at least 0.0005 inch (0.0627 millimeters) in thickness and contain a minimum of 8 weight percent chromium over that contained in the substrate alloy. On top of the first coating 9 there is a second coating of aluminum alone or an aluminum-silicon combination 11. Layer 11 should also have a thickness of at least 0.002 inch (0.0508 millimeters). We further prefer that the combined thickness of the first coating and the second coating be at least 0.005 inch (0.127 millimeters), containing at least 20 weight percent aluminum at the coating surface. It should be understood that both diffusion coating layers also contain the same elements present in the substrate alloy, although in different concentration from those found in the substrate alloy. High temperature aging also beneficially modifies the chemistry of these layers, as taught here.

We tested laboratory samples and samples taken from a coil in an ethylene furnace of the type shown in FIG. 4. The aged laboratory sample material of the diffusion coating system came from actual HP Nb microalloyed centrifugally cast material. Both laboratory samples, as well as samples from the full furnace coated for service in an ethylene steam cracker furnace, were produced using the same diffusion coating system as described above in discussing FIG. 1.

The results of the analysis are set forth in Table 1 and Examples 1 & 2.

EXAMPLE 1

The ethylene furnace used for the full furnace diffusion coating trial has a 24 coil design. The coils are a serpentine type design with four radiant passes each. One such coil 20 is illustrated in FIG. 4. Each coil has a double pipe quench exchanger formed by first tube 21, second tube 22, third tube 23 and fourth tube 24. Feedstock enters the inlet 25 and passes through the tubes to an outlet 26. The outlet 26 goes to a common coke collection header and then to a secondary transfer line exchanger. The furnace uses a combination of floor and wall burners.

Each coil uses both HK-40 and HP niobium (Nb) Modified microalloyed (HP Nb MA) alloys. The first two radiant passes of the coil, tubes 21 and 22, are the cold passes. These passes are made of HK-40 tubing and return bends. The last two passes, tubes 23 and 24, are the hot passes. These tubes and return bends are made of the HP Nb MA alloy.

The diffusion coating system applied to the ID surfaces of the HK-40 and HP Nb MA tubes and return bends prior to installation in the ethylene furnace was a bi-diffusion (two step) coating system as taught by Wynns and Bayer in U.S. Pat. No. 5,873,951. This ID modified pack cementation applied diffusion coating system was designed to enrich the substrate tube surface metallurgy with chromium, silicon, and aluminum, providing a dual-layer system which provides excellent high temperature resistance to carburization and catalytic coke formation.

It should be noted that a diffusion coating is not a surface-only coating as commonly defined. Instead, the diffusion coating elements are deeply diffused into the substrate alloy forming a new alloy in the surface layers of the substrate. This surface alloy is metallurgically bonded to the substrate alloy and is highly resistant to chipping, peeling, and spalling.

The aluminum enrichment in the outer layer of the diffusion system provides an immediate line of protection against carburization and catalytic coke formation by a dense and adherent aluminum oxide film, renewed during the steam-air de-coking cycle. The chromium-enriched inner layer of the diffusion system establishes a barrier for nickel exposure at the surface, consequently reducing coke collection on the ID surface. Additionally, silicon supports and strengthens the aluminum oxide surface layer and helps to reject carbon as it attempts to migrate into the substrate alloy, thus minimizing chromium depletion through carbide formation.

Further metallurgical and microstructural details of the diffusion coating system will be provided later in this section discussing the results of the coating evaluation by a variety of analysis techniques.

The coated tubes and return bends were welded together with a welding technique developed by the ethylene furnace operator, and installed into the furnace at the operator's facility. The furnace with the coated tubes was placed in operation in November 1997.

Furnace Operation Experience

The furnace cracks high purity ethane with a normal rate of 65% conversion of ethane to ethylene. During the first 14 months in service, the average furnace run length was improved from 30 days prior to installing uncoated tubes to more than 60 days after the installation of diffusion coated tubes, even with increase in conversion rate from 65% to 70%. In fact, coke was no longer the main reason the furnace was shut down during the first 14 months of operation. Only two runs ended due to coke buildup during this period. The majority of the runs ended early due to maintenance needs not related to coke formation. It was estimated by regression analysis that the furnace run length could have been extended to over 90 days for de-coking alone if the other maintenance needs are taken into account.

There were also other indications verifying lower coke formation in the diffusion coated tubes in addition to the longer run length. These included the following:

1. Carbon monoxide formation—No carbon monoxide spike was observed after feed was introduced into the coated furnace tubes. Carbon monoxide levels at furnace startup are typically high using uncoated tubes due to the catalytic activity of iron and nickel in coke formation; a high initial level of carbon monoxide is an indicator of this reaction.

2. Shortened decoke cycle time—Decoke time in the furnace prior to installation of coated tubes was about 48 hours. Over the first 14 months of furnace operation with coated tubes, the burn (coke removal) time was always less than 24 hours. This was attributed to the coke being of the less dense thermal type, as opposed to the dense and hard catalytic coke formed in ethane cracking in uncoated tubes.

3. Less spalled coke—Much less coke was found in the 24 inch common coke collection header after the coated tubes were installed. This header connects to the primary quench exchanger and prevents spalled coke from entering the secondary transfer line exchanger.

Metallographic and scanning electron microscopic examination of samples were also conducted from one coil removed at this 14 month point. The results showed no loss of diffusion coating, and no carburization.

From one tube section, a metallographic cross sectional sample of the diffusion coating-substrate was cut and polished according to standard procedures. Optical microscopy and scanning electron microscopy/energy dispersive x-ray fluorescence spectrometry were conducted. Composition depth profiles were obtained and different metallurgical phases were identified and analyzed by scanning electron microscopy/energy dispersive x-ray fluorescence spectrometry.

The photomicrographs as well as the scanning electron micrograph of the intact coating show a diffusion layer thickness of approximately 0.009–0.010 inch (0.23–0.25 millimeters). The diffusion coating shows two primary layers, with a rather thick interdiffusion band in between. A number of different phases can be identified, however, there is no indication of carburization. The following Table 1 provides a cross sectional composition profile as measured from the diffusion coating surface.

TABLE 1

Cross Sectional Composition Profile as Measured from the Diffusion Coating Surface, In Service for 14 Months.

| Depth from Surface (inch) | Weight % Al | Weight % Cr | Weight % Si | Weight % Fe | Weight % Ni | Weight % O |
|---|---|---|---|---|---|---|
| 0.0004 | 0.3 | 72.7 | 0.4 | 12.4 | 3.4 | 7.1 |
| 0.0014 | 0.3 | 74.2 | 0.5 | 11.7 | 2.8 | 6.9 |
| 0.0024 | 19.5 | 3.3 | 1.2 | 12.0 | 60.0 | 2.1 |
| 0.0034 | 19.2 | 2.3 | 1.2 | 12.8 | 58.2 | 1.0 |
| 0.0044 | 20.0 | 4.1 | 1.4 | 12.4 | 58.2 | 1.2 |
| 0.0054 | 0.6 | 41.6 | 5.6 | 34.9 | 10.1 | 4.4 |
| 0.0064 | 0.2 | 75.4 | 0.6 | 9.7 | 3.2 | 6.6 |
| 0.0074 | 0.5 | 41.7 | 5.2 | 34.2 | 12.8 | 4.0 |
| 0.0084 | 0.2 | 73.9 | 0.5 | 10.1 | 4.5 | 6.8 |
| 0.0094 | 1.1 | 20.2 | 3.3 | 41.2 | 30.0 | 2.1 |

From the scanning electron micrograph, 4 distinct layers can be seen, with an additional 3 different secondary particulate-like phases at irregular locations. On the outermost surface, to a depth of about 0.0012 inch (0.03 millimeters), two thin layers were identified, with the outermost surface being pure aluminum-oxygen (aluminum oxide). Underneath this is a continuous metallic phase with about 76% Cr, about 14% Fe and 4% Ni. The third layer is between 0.0020–0.0048 inch (0.05–0.12 millimeters) deep, consisting of mainly nickel aluminide (about 20% Al, 60% Ni, balance Fe and Cr). Underneath the third layer is an region of high Cr concentration, 44%, with about 37% Fe and rather low in Ni (14%). The 3 other particulate-like phases are intermetallic phases partially very high in some of the base alloying elements (silicon-enriched, aluminum nitride, niobium silicide).

On both the depth profile as well as on the specific phase analysis, the original two layer structure of the diffusion coating system can be identified. It is important to note that the accuracy of the energy dispersive x-ray fluorescence spectrometric method is limited and strongly dependent on the actual phase, which is analyzed (i.e. "hit" by the x-rays). Between 0.0020–0.0096 inch (0.05–0.24 millimeters), both original diffusion layers (Cr—Si and Al—Si) still exist. The high Cr concentration of the inner Cr—Si layer still prevents Al from diffusing inwards. The outer Al—Si layer still shows about the same Ni and Fe concentrations as the original coating, with some depletion of the Al content.

Both diffusion layers appear to supply Al+Cr to the very tube surface, forming a stable scale of Al and Cr oxides. The diffusion layers virtually act as a kind of "enrichment pool," supplying the elements to stabilize the protective layer at the outermost surface. This surface layer still shows no increase in Fe or Ni concentrations. Its protective role is unchanged.

EXAMPLE 2

After 27 months in service, the furnace run length was still between 45 to 60 days with a conversion rate between 68% and 70%. The shorter run lengths were due to a few tubes that were exposed to high temperatures, high enough to spall the coating due to tube creep-related rupture of the interface between the coating and the tube. These tubes should be collecting coke due to loss of coating and, consequently, with a carburized ID surface where the coating was removed. This was confirmed by metallurgical evaluation of a tube in the high temperature zone.

A second coil was removed from the furnace in March 2000 after 2 years and 3 months (27 months) of service for continued examination of the diffusion coating. This coil was one of the coils limiting the furnace run length. It was also believed to be the coil with the worst creep damage in the furnace, due to localized high temperature because of uneven heating of the tubes in the furnace, and not due to coating damage that was actually the result of the high temperature. Sample #1 is a control sample of the same ID-coated material, which was not placed in service, but was evaluated for quality control purposes. In summary, the in-service Samples #2 through #5 were located as indicated by the references $S_2$, $S_3$, $S_4$ and $S_5$ in FIG. 2. Sample #2 was taken from furnace tube 23, 0.5 foot (15 centimeters) from bottom return bend weld. The approximate maximum tube metal temperature reached by this area of the tube was 1950° F.–2000° F. (1066° C.–1093° C.). Sample #3 was taken from furnace tube 23, 10 feet (3 meters) from bottom return bend weld. The approximate maximum tube metal temperature reached by this area of the tube was 2100°+ F. (1149°+ C.). Sample #4 was taken from furnace tube 24, 6 feet (2 meters) from bottom return bend weld. The approximate maximum tube metal temperature reached by this area of the tube was 1950° F.–2000° F. (1066° C.–1093° C.). Sample #5 was taken from furnace tube 24, 2 feet (0.6 meters) from the top weld to elbow connected to outlet. The approximate maximum tube metal temperature reached by this area of the tube was 2150° F.–2200° F. (1177° C.–1204° C.).

The reported temperatures of Samples #2 and #4 are based on furnace design temperature curves. Sample #3 showed the coating cracked and ready to spall in a few places. It was found in the earlier developmental tests on coated specimens that the coating does not spall after several cycles from room temperature to 2100° F. (1149° C.). Based on the test data, the tube temperature for Sample #3 was estimated to be above 2100° F. (1149° C.), but not too high above it. The microstructure of tube material from Samples #5 showed signs of incipient fusion; hence, the temperature was estimated between 2150° F.–2200° F. (1177° C.–1204° C.).

Several analytical techniques were employed to evaluate metallurgical samples of both tubing as-coated (Sample #1) and tubing as-coated/in-service 27 months (Samples #2 through #5). These techniques included scanning electron microscopy/energy dispersive x-ray fluorescence spectrometry, including coating thickness evaluation, Vickers microhardness testing, and carbon content analysis. Prior to all analyses, except for carbon content analysis, coating-substrate cross sections were cut mounted, ground, and polished using standard metallographic laboratory procedures. Vilella's reagent was used as the microetchant. Depth profiles for carbon contents of Samples #2 and #3 were obtained by machining layers of 0.010 inch (0.250 millimeters) thick for individual analyses, starting from the ID surface of the sample tubes and continuing to a depth where the weight percent carbon leveled off at the original substrate alloy chemistry (0.5 weight percent carbon).

Scanning electron micrographs using secondary electron imaging, as well as approximate elemental compositions at points throughout the diffusion coating, obtained by energy dispersive x-ray fluorescence spectrometry, were obtained for cross-sectional mounted Samples #1 through #5. Tables 2 through 6 provide approximate elemental composition profiles throughout the coating and into the substrate alloy for Samples #1 through #5.

The as-coated HP Nb MA Sample #1, which composition profile is given in Table 2, displays an overall coating thickness of approximately 0.016 inch (0.400 millimeters) separated into two distinct bands, and possesses an aluminum-rich outer coating surface layer containing over 36 weight percent aluminum. As discussed earlier, this is critical in providing the first line of protection due to the formation of an adherent aluminum oxide film, as well as to tying up free iron and nickel and preventing catalytic coke formation. The inner diffusion layer, enriched in chromium (30 weight percent) and silicon (over 2 weight percent), provides enhanced stability of the aluminum-rich outer layer in its role of preventing carburization and catalytic coke formation.

TABLE 2

Cross Sectional Composition Profile as Measured from the Diffusion Coating Surface, Sample #1, as Processed.

| Depth from Surface (inch) | Weight % Al | Weight % Cr | Weight % Si | Weight % Fe | Weight % Ni |
|---|---|---|---|---|---|
| 0.001 | 36.5 | 10.8 | 1.5 | 17.5 | 33.7 |
| 0.005 | 14.8 | 15.5 | 1.9 | 14.1 | 53.7 |
| 0.009 | 1.6 | 28.6 | 2.7 | 40.1 | 27.0 |
| 0.015 | 1.1 | 30.6 | 2.6 | 38.1 | 27.6 |
| 0.019 | 0.6 | 25.0 | 1.2 | 36.1 | 37.1 |

Samples #2 through #4, whose composition profiles are given in Tables 3 through 5, all still possess a coating thickness ranging from 0.023 inch (0.575 millimeters) to 0.026 inch (0.650 millimeters), as well as 16–20 weight percent aluminum at the outer coating surface layer, even after 27 months in service at tube metal temperatures in excess of 2000° F. (1093° C.), up to 2100° F. (1149° C.). Therefore, some degree of continued diffusion of the coating elements into the substrate is evident. However, these data indicate that the surface layer will continue to be protective for a substantial additional period of time, possibly double or greater the current service lifetime, given Fick's law limitations. The inner layer of these samples appear to be increasing in concentrations of chromium (32–42 weight percent) and silicon (3–6 weight percent), providing continued stability of the aluminum-rich layer with continued high-temperature service.

TABLE 3

Cross Sectional Composition Profile as Measured from the Diffusion Coating Surface, Sample #2, In Service 27 Months.

| Depth from Surface (inch) | Weight % Al | Weight % Cr | Weight % Si | Weight % Fe | Weight % Ni |
|---|---|---|---|---|---|
| 0.001 | 17.1 | 12.3 | 2.2 | 29.6 | 38.8 |
| 0.010 | 11.1 | 34.8 | 1.2 | 12.0 | 40.9 |

TABLE 3-continued

Cross Sectional Composition Profile as Measured from the Diffusion Coating Surface, Sample #2, In Service 27 Months.

| Depth from Surface (inch) | Weight % Al | Weight % Cr | Weight % Si | Weight % Fe | Weight % Ni |
|---|---|---|---|---|---|
| 0.016 | 3.2 | 41.3 | 4.1 | 33.8 | 17.6 |
| 0.023 | 1.3 | 30.5 | 3.5 | 41.8 | 22.9 |
| 0.029 | 0.0 | 27.4 | 2.5 | 39.1 | 31.0 |

TABLE 4

Cross Sectional Composition Profile as Measured from the Diffusion Coating Surface, Sample #3, In Service 27 Months.

| Depth from Surface (inch) | Weight % Al | Weight % Cr | Weight % Si | Weight % Fe | Weight % Ni |
|---|---|---|---|---|---|
| 0.001 | 20.9 | 4.7 | 4.0 | 18.5 | 51.9 |
| 0.011 | 22.4 | 2.6 | 1.9 | 14.4 | 58.7 |
| 0.017 | 6.7 | 32.4 | 5.2 | 28.8 | 26.9 |
| 0.023 | 3.7 | 36.6 | 6.9 | 34.8 | 18.0 |
| 0.032 | 0.0 | 28.4 | 2.6 | 37.7 | 31.3 |

TABLE 5

Cross Sectional Composition Profile as Measured from the Diffusion Coating Surface, Sample #4, In Service 27 Months.

| Depth from Surface (inch) | Weight % Al | Weight % Cr | Weight % Si | Weight % Fe | Weight % Ni |
|---|---|---|---|---|---|
| 0.001 | 16.0 | 19.7 | 1.3 | 29.9 | 33.1 |
| 0.011 | 13.4 | 19.1 | 2.9 | 16.0 | 48.6 |
| 0.020 | 3.2 | 43.0 | 3.2 | 31.4 | 19.2 |
| 0.024 | 0.5 | 37.8 | 3.1 | 39.1 | 19.5 |
| 0.028 | 0.0 | 27.1 | 1.6 | 38.4 | 32.9 |

Sample #5, which composition profile is given in Table 6, is certainly rapidly losing its protective outer layer, with a surface aluminum concentration of 5 weight percent as well as an overall thickness of from 0.032 inch (0.800 millimeters) to 0.033 inch (0.825 millimeters). Obviously, the severe temperature conditions experienced at this location in the furnace have caused more extensive diffusion of the coating elements into the substrate. However, the basic microstructural features of the diffusion coating are still evident, with the formation of additional banding microstuctures and with the introduction of porosity into the outermost layers of the coating microstructure. Given this sample section was exposed to tube metal temperatures in the range of 2150° F. –2200° F. (1177° C.–1204° C.), we can clearly state that temperatures in excess of 2150° F. (1177° C.) induce instability in the diffusion coating system during the service life of the tube. It is probably safer to state, based on these data, that the maximum tube metal temperatures in the furnace not exceed 2100° F. (1149° C.) in order to maintain coating stability and reliability.

TABLE 6

Cross Sectional Composition Profile as Measured from the
Diffusion Coating Surface, Sample #5, In Service 27 Months.

| Depth from Surface (inch) | Weight % Al | Weight % Cr | Weight % Si | Weight % Fe | Weight % Ni |
|---|---|---|---|---|---|
| 0.001 | 5.1 | 33.5 | 2.0 | 22.9 | 36.5 |
| 0.011 | 5.5 | 15.6 | 1.6 | 26.4 | 50.9 |
| 0.021 | 7.0 | 5.7 | 1.1 | 16.3 | 69.9 |
| 0.029 | 0.9 | 36.0 | 1.9 | 46.1 | 15.1 |
| 0.038 | 0.0 | 27.2 | 1.5 | 38.0 | 33.3 |

Vickers microhardness measurements from Samples #2, and #3 are presented in Table 7. From the data presented, it is evident that the hardness profile of Sample #2 is relatively constant going from the coating-substrate interface into the bulk tube (155–169 HV, hardness Vickers), showing a complete absence of substrate hardening. Some slight degree of hardening is seen immediately under the coating in Sample #3 (179 HV), experiencing somewhat more severe temperature exposure conditions than Sample #2, indicating a small but insignificant effect in the substrate adjacent to the surface.

TABLE 7

Vicker's microhardness profile under coating-Samples #2 and #3.

| Distance from ID Inch (millimeters) | Sample #2 Vickers (Rockwell B) | Sample #3 Vickers (Rockwell B) |
|---|---|---|
| 0.02 (0.5) | 162 (84) | 179 (88) |
| 0.06 (1.5) | 155 (82) | 158 (83) |
| 0.10 (2.5) | 155 (82) | 159 (83) |
| 0.14 (3.6) | 161 (84) | 158 (83) |
| 0.18 (4.6) | 169 (86) | 155 (82) |
| 0.22 (5.6) | 165 (85) | 159 (83) |

Carbon content analyses from Samples #2 and #3 are presented in Table 8. From the data presented, it is clear that the carbon content profile of Sample #2 is relatively constant going from the coating surface into the bulk tube (0.48–0.53 weight percent), indicating an almost complete absence of carbon pickup, or carburization. Sample #3, experiencing somewhat more severe temperature exposure conditions than Sample #2, shows a slight carbon pickup in the first 0.020 inch (0.500 millimeters) of the coating from the ID surface (0.62–0.81 weight percent). However, underneath the coating and into the substrate, the carbon content is again at the level of the original substrate tube (0.50 weight percent). These results prove the ability of the diffusion coating system to prevent carbon pick-up and carburization under the given exposure conditions.

TABLE 8

Carbon analysis profile-Samples #2 and #3-weight percent carbon at every 0.01 inches (0.25 millimeters) from ID.

| Distance from ID, Inch (millimeters) | Tube material from Sample #2 (wt. % C) | Tube material from Sample #3 (wt. % C) |
|---|---|---|
| 0.00–0.01 (0.00–0.25) | 0.53 | 0.81 |
| 0.01–0.02 (0.25–0.51) | 0.50 | 0.62 |
| 0.02–0.03 (0.51–0.76) | 0.48 | 0.50 |
| 0.03–0.04 (0.76–1.02) | 0.49 | 0.50 |
| 0.04–0.05 (1.02–1.27) | 0.51 | 0.50 |
| 0.05–0.06 (1.27–1.52) | — | 0.48 |
| 0.06–0.07 (1.52–1.78) | — | 0.49 |
| 0.07–0.08 (1.78–2.03) | — | 0.50 |
| 0.08–0.09 (2.03–2.29) | — | 0.48 |
| 0.09–0.10 (2.29–2.54) | — | 0.50 |

In conclusion, metallurgical evaluation of the ID diffusion coated HP Nb MA tube samples after 27 months in service in the ethylene furnace has shown that the aluminum-chromium-silicon bi-diffusion coating system is thermally stable in the ethylene furnace environment at tube metal temperatures of up to 2100° F. (1149° C.). Additionally, the bi-diffusion coating system provides excellent carburization resistance within the temperature limits of its thermal stability range, up to 2100° F. (1149° C.).

EXAMPLE 3

For experimental studies, Zimmermann, Zychlinski, Woerde, and van den Oosterkamp teach a standardized artificial aging procedure in the paper "Absolute Rates of Coke Formation: A Relative Measure for the Assessment of the Chemical Behavior of High-Temperature Steels of Different Sources." At our request, Dr. Zychlinski performed this test on samples of HP 40 Nb modified microalloyed sample coupons, both bare coupons and coupons coated by us with the present chromium-silicon/aluminum diffusion coating. Dr. Zychlinski reported his results in a paper titled "Characterization of Material Samples for Coking Behavior of HP 40 Material with and without AlcroPlex Surface Modification using both Naphtha and Ethane Feedstocks." This study involved labs tests in a thermobalance system for the pyrolysis of two different feedstocks under typical technical reaction parameters, performed with standard HP 40 Nb modified microalloyed base material as well as chromium-silicon/aluminum diffusion coated base material. The test results revealed that the chromium-silicon/ aluminum diffusion coating decreases the coking rates by 80% in the case of the naphtha feedstock and by 90% in the case of the ethane feedstock. This result was achieved despite the artificial aging of the test material through four (4) consecutive coking/decoking cycles. He found that the diffusion coating suppresses the catalytic coking by blocking the active (iron & nickel) surface, which results in a norming of the coking. This refers to a significantly lower standard deviation of the results. Finally, the diffusion coating results in practically zero formation of carbon monoxide.

While we have described and illustrated certain present preferred embodiments of our diffusion coating system and ethylene furnace tubes coated with our coating, it should be distinctly understood that our invention is not limited thereto, but may be variously embodied within the scope of the following claims.

We claim:

1. A method of coating a surface of a metal product formed from a metal alloy selected from the group consisting of iron based alloys, nickel based alloys and nickel base alloys containing chromium, comprising:

preparing the surface to remove diffusion limiting oxides; and diffusing a sufficient amount of chromium and silicon into the surface to form a first coating having a thickness of at least 0.0005 inch (0.0127 millimeters), containing at least 8 weight percent more chromium than contained in the substrate alloy, which is followed by diffusing a sufficient amount of aluminum, or aluminum-silicon to form on the first coating a second coating having a total thickness of at least 0.005 inch (0.0127 millimeters) and containing at least 20 weight percent aluminum at the coating surface.

2. The method of claim 1 wherein the metal alloy contains manganese and further comprising aging the diffusion coating by heating to a temperature between 1292° F. and 2100° F. (700° C. and 1150° C.) to achieve a desired migration of chromium and manganese to form a final protective layer at the surface.

3. The method of claim 1 also comprising the step of diffusing chromium and silicon in a manner to produce at least 30 weight percent chromium at a surface of the first coating adjacent to the second coating through thermal aging.

4. The method of claim 1 wherein the first coating has a silicon content of at least 0.5 weight percent.

5. The method of claim 1 wherein the diffusion step is performed by a process selected from the group consisting of chemical vapor deposition, surface physical vapor deposition process, weld overlay and diffusion, and thermal spray and diffusion.

6. The method of claim 5 also comprising heating an exposed surface of at least one of the layers during the diffusion step.

7. The method of claim 6 wherein the heating is done at a temperature of from 1800° F. to 2400° F. (982° C. to 1315° C.).

8. The method of claim 1 wherein at least one of the first coating and the second coating is applied in multiple steps.

9. The method of claim 1 wherein at least one of the first coating and the second coating are applied by a process selected from the group consisting of:

diffusing material in multiple steps via a pack cementation in contact method;

diffusing material in multiple steps via ceramic insert;

depositing and diffusing material in multiple steps via PVD method from a master alloy emitter manufactured with metal layers physically layered on a carrier;

depositing via weld overlay in multiple steps and diffusion; and thermal spray from a master alloy and diffusion in multiple steps.

10. The method of claim 1 wherein the surface is an inner wall of a tube and the diffusion step applies at least one layer by:

providing a target emitter containing each layer chemistry in the tube;

closing both ends of the tube;

preparing the surface first with an oxide removal step;

depositing each layer with a process selected from the group consisting of chemical vapor deposition, physical vapor deposition, weld overlay and thermal spray;

heating the tube to an elevated temperature for a sufficient time to create a diffusion coating on the inner wall; and heating the diffusion coating with a pretreatment vapor of argon and nitrogen at a temperature of from 1800° F. to 2400° F. (982° C. to 1315° C.).

11. The method of claim 1 wherein the surface is an inner wall of a tube and the diffusion step applies at least one layer by:

placing in the tube an insert formed from a ceramic composite containing a filler, a binder and at least one coating material selected from the group consisting of, chromium and silicon;

sealing both ends of the tube;

placing the tube under a vacuum;

cleaning with high temperature hydrogen;

depositing at least one coating material using physical vapor deposition; and heating the tube to an elevated temperature for a sufficient time to create a diffusion coating on the inner wall.

12. The method of claim 1 also comprising polishing the surface of the coating with at least one of mechanical means, chemical means and electropolishing.

13. The method of claim 1 wherein the metal product is a product selected from the group consisting of furnace tubes, fittings, exchanger tubes, chemical process piping, process fittings, valves, pumps, compressors, boiler components, steam piping, and waste heat incinerators.

14. The method of claim 1 wherein manganese is also diffused onto the surface with any of the chromium, silicon and aluminum.

15. The method of claim 1 wherein the surface is prepared by exposing the surface to hydrogen.

* * * * *